Feb. 16, 1960 Z. ATLAS 2,925,476

AUTOMATIC GAIN CONTROL CIRCUIT

Filed Oct. 16, 1956

INVENTOR.
ZENAS ATLAS
BY Darby & Darby
ATTORNEYS

United States Patent Office 2,925,476
Patented Feb. 16, 1960

2,925,476

AUTOMATIC GAIN CONTROL CIRCUIT

Zenas Atlas, Teaneck, N.J., assignor to Allen B. Du Mont Laboratories, Inc., Clifton, N.J., a corporation of Delaware Application October 16, 1956, Serial No. 616,221

5 Claims. (Cl. 330—130)

This application relates to electronic amplifiers, and in particular to gain control circuits such as AGC (automatic gain control).

For simplicity of explanation, the instant invention will be discussed in terms of a television receiver; however, the principles herein disclosed are applicable to any chain of amplifiers subject to varying strength incoming signals, possibility of overloading, and noise limitations.

In a television receiver the incoming signal is sequentially applied to a chain of amplifiers to produce an output signal of the desired strength. This chain comprises a radio frequency amplifier, an intermediate frequency amplifier, and numerous other types of amplifiers as may be required. For weak incoming signals, each amplifier stage is operated at its maximum gain. When the strength of the incoming signal increases, the overall gain is reduced to maintain an output signal of the original intensity. Thus, when it is necessary to reduce the overall gain, there is a choice as to which stage or stages should have its gain reduced.

Each amplifier has inherent within itself various conditions which produce a disturbance known as "noise"—or in the case of a television receiver, "snow." It is well known that for a chain of amplifiers the output signal contains a minimum of noise when the first amplifier is operating at maximum gain. It is therefore desirable that the overall gain of the amplifier chain be reduced by decreasing the gain of later amplifier stages in order to obtain the desired strength of the output signal with a minimum amount of noise.

Unfortunately, however, these latter stages frequently do not have a large enough control range for this purpose, and therefore it becomes necessary to reduce the gain of the first or RF stage with a resultant deterioration of the signal-to-noise ratio in the output signal.

Since local stations produce a much stronger incoming signal than distant stations, many television receivers have a "local-distant" switch which additionally decreases the overall gain for strong local signals.

It is therefore one object of my invention to provide an improved gain control circuit.

It is still another object of my invention to provide a gain control circuit which continuously and automatically adjusts the overall gain for optimum conditions of amplification and noise.

It is a further object of my invention to provide a gain control circuit which eliminates the necessity of a local-distant switch.

Figure 2:
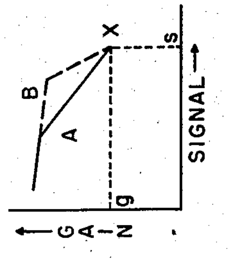
Figure 1:
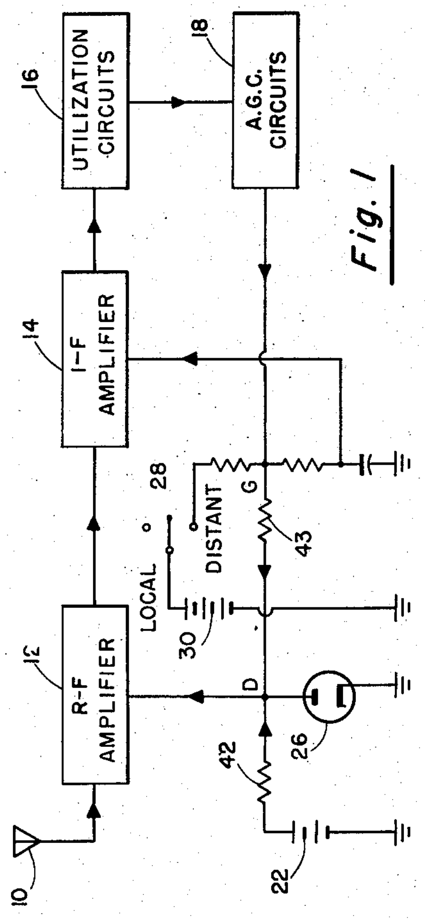
Figure 3:
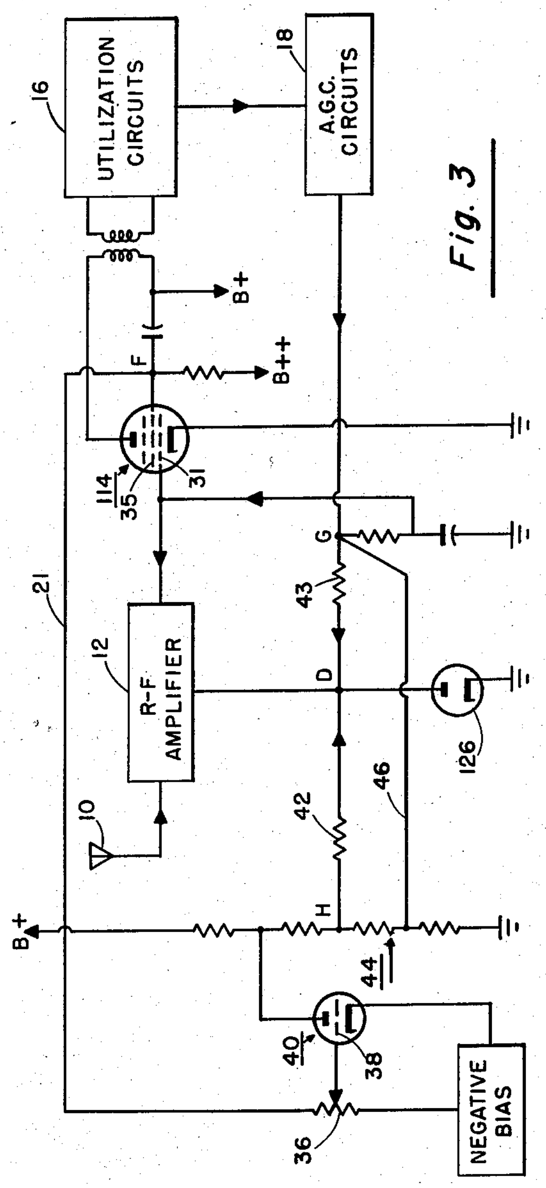

The attainment of these objects and others will be realized from the following specification, taken in conjunction with the drawings, of which, Fig. 1 is a schematic representation of automatic gain circuits as previously used;

Fig. 2 is a set of curves showing the response with changes of incoming signal strength; and Fig. 3 is a diagrammatic representation of one embodiment of my invention.

My invention contemplates a gain control circuit wherein a correction voltage produced by incoming signals is selectively amplified, and progressively applied to selected amplifiers in the chain. Thus, in the case of medium strength incoming signals, only the amplification of later amplifiers is affected. As the strength of the incoming signal increases, the amplification of earlier stages is progressively reduced, while for extremely strong incoming signals the gain of all stages is additionally reduced.

Referring now to Fig. 1, antenna 10 provides an incoming signal which is applied to a first amplifier 12, shown as an RF stage. The amplified signal is then applied to subsequent amplifiers, the illustration showing an IF stage 14 which may in itself comprise several amplifiers. The amplified signal is finally fed to utilization circuits shown diagrammatically as block 16.

For weak incoming signals, the first (or RF) amplifier and subsequent (IF) amplifiers are operated at maximum gain, and no signal is produced by AGC circuit 18.

When the incoming signal increases to a moderate strength, automatic gain circuit 18 produces a negative going AGC signal which is used to reduce the overall gain of the system. This AGC signal is applied to a subsequent amplifier in order to reduce the output signal without increasing the noise, as has been previously pointed out. Specifically, the circuit applies a small negative going AGC voltage to the IF amplifier, whose gain is thus reduced to maintain uniform output for utilization circuit 16.

For high strength incoming signals, the selected subsequent stage is frequently unable to sufficiently reduce the overall gain to reestablish the desired level of output signal. In addition, it may be overloaded by the signal applied to it by the first stage. In this case, the AGC signal must be applied to the first stage, 12, even at the risk of producing more noise in the output signal. The delay introduced before reducing the gain of the first amplifier gives rise to the phrase "Delayed A.G.C."

In order to delay the action of AGC, and to maintain RF amplifier 12 immune to small variations of the incoming signal, and thus small AGC signals, a disabling circuit comprising potential source 22, and a clamping diode 26, establishes at junction D a suitable potential that is too positive to be overcome by small signals developed by the automatic gain control circuit 18. However, as the AGC signal becomes more negative, due to the high strength incoming signal, it will overcome the potential established at point D, and apply to RF amplifier 12 a negative going signal which is utilized to increase its gain to compensate for the stronger incoming signal.

The effect of this operation may be seen from curve A of Fig. 2. For small increases in strength of the input signal, the overall gain decreases slightly. At a transition point, when the delaying effect of the disabling circuit is overcome, the gain decreases more rapidly with increasing strength of the incoming signal.

As has been stated, overall gain is reduced in steps; first by reducing the gain of subsequent amplifiers, and then at a predetermined point reducing the gain of the earlier amplifier. Once the first amplifier is made responsive to the AGC signal, gain is reduced (as shown by the slope of curve A) at a rate determined by the circuit of the RF amplifier and the difference between the AGC signal and the fixed potential established by source 22. Point X of Fig. 2 indicates that to prevent overloading for an incoming signal of strength *s*, the gain must be less than *g*. Since point X and the slope of curve A are both established, the transition point of curve A is predetermined. Unfortunately, this often occurs before the optimum transition point that would be determined by noise considerations.

As was previously stated, local stations generally produce a much stronger incoming signal than do distant stations. These signals may be so strong as to completely overload all the circuitry. In order to eliminate this possibility, a "local-distant" switch 28 shown in Fig. 1 is utilized. For local stations of high signal strength, switch 28 is in its "local" position and has no effect. When the switch is in its "distant" position, however, a potential obtained from source 30 establishes at point G a positive potential which immunizes the amplifiers against all AGC signals, even those resulting from disturbances, such as static.

In order to overcome the above disadvantages and the need for a local-distant switch, my invention produces a gain control signal which is more effective in compensating for variations in the strength of the incoming signal. This may be seen in Fig. 3.

In my invention the incoming signal from antenna 10 traverses RF amplifier 12, is amplified thereby, and is applied to control grid 31 of a subsequent amplifier 114, which may be a gain-controlled IF amplifier stage. The signal is eventually applied to utilization circuit 16, which provides a signal to automatic gain circuit 18, as previously described. When the strength of the incoming signal increases, AGC circuit 18 produces a negative-going AGC signal which is applied back to control grid 31 of tube 114, as previously explained, to reduce the grid bias of the IF stage, and thus its gain.

The downvolting of grid 31 reduces the current in tube 114, thus upvolting screen grid 35, causing the potential at point F to approach that of B++. A positive-going signal is thus made available. Alternately, this positive-going signal may be obtained from the anode of tube 114. In either case, this increased potential is applied over connection 21 to a voltage divider 36 whose lower end is suitably biased. A portion of the increased voltage from voltage divider 36 is applied to control grid 38 of an amplifier and phase inverter 40. The negative-going correcting signal from tube 40 is applied to voltage divider 44.

For weak incoming signals, changes in the gain of RF amplifier have been prevented by clamp tube 126 in the same manner as previously described. The transition point where RF amplifier 12 has its gain reduced is now determined by clamp tube 126, the strength of the AGC signal, the operation of tubes 114 and 40, and the action of voltage divider 44. As soon as operation passes the transition point, two varying voltages affect the gain of RF stage 12. The first is the negative going AGC signal from AGC source 18, which is similar to the action of the prior art circuit of Fig. 1. The second is the negative going correcting signal obtained from voltage divider 44, this being entirely different from the fixed potential produced by potential source 22 of Fig. 1.

It may be seen from Fig. 3 that during quiescence, isolating resistances 42 and 43 form a voltage divider between point G, which is relatively positive, and point H, which is relatively negative. Thus, point D has a potential which is intermediate G and H. This corresponds to the prior art quiescent condition. The situation as produced by my invention for incoming signals maintains the same relatively negative potential at point G, but lowers the potential at point H in accordance with the strength of the incoming signal. Since the potential at point H drops rapidly with increasing strength of the incoming signal, due to the operation at screen grid 35 of tube 114, and at tube 40, the resultant potential at point D drops much more rapidly than in the prior art circuitry.

Referring again to Fig. 2, dashed curve B shows the operation as improved by my invention. The portion of the curve beyond the transition point is much steeper, thus allowing the transition point to be moved to the right. This movement permits a longer delay before the RF amplifier becomes responsive to the AGC signal, thus permitting the position of the transition point to be established by noise considerations. Since the slope of curve B is now adjustable independently of amplification requirement of RF amplifier 12, any desired combination of transition point position and slope may be obtained for optimum operation from the point of view of noise and of overloading.

Thus, the improved circuit provided by my invention applies to RF stage 12, a more effective delayed AGC signal due to the fact that a previously fixed potential has been replaced by a potential which varies with the strength of the incoming signal.

It will be recalled that in Fig. 1, local-distant switch 28 provided a positive potential for weak incoming signals. My invention has an additional feature in that it eliminates the switch, and provides a second varying strength negative going correcting signal for strong input signals. This may be seen in Fig. 3 where voltage divider 44 provides for strong incoming signals, a negative going signal which is applied over connection 46 to point G, there adding to the AGC signal applied to control grid 31 of tube 114.

The foregoing specification has disclosed the principles of my invention and one embodiment thereof. Since modifications will occur to those skilled in the art, I desire to be limited not by the foregoing illustrations, but rather by the claims granted to me.

What is claimed is:

1. A gain control circuit for a chain of amplifiers comprising: a first amplifier of said chain having an input circuit and an output circuit; a second amplifier of said chain having an input circuit and an output circuit, said output circuit of said second amplifier comprising a screen grid and a first voltage divider connected to said screen grid to be energized thereby; a connection between the output circuit of said first amplifier and the input circuit of said second amplifier; an electron discharge device having an input circuit and an output circuit, said output circuit of said device comprising a second voltage divider; a connection between the output terminal of said first voltage divider and said input circuit of said device; and a connection between the output terminal of said second voltage divider and said input circuit of said first amplifier.

2. The circuit of claim 1 including a connection from said second voltage divider to the input circuit of said second amplifier.

3. A delayed gain control circuit for a chain of amplifiers adapted to amplify an incoming signal, comprising: a first amplifier having an input and an output circuit; a second amplifier comprising a pentode, and having an input and an output circuit, said output circuit comprising a first voltage divider connected between the screen of said pentode and a source of bias voltage; a connection between said output circuit of said first amplifier and the input circuit of said second amplifier; means energized by one amplifier of said chain to provide a gain control signal; a connection between the output of said gain control producing means and said input circuit of said second amplifier to control the gain thereof; an electron discharge device having an input circuit and an output circuit, said output circuit comprising a second voltage divider; a connection between the output terminal of said first voltage divider and said input circuit of said device; a connection between the output terminal of said second voltage divider and said input circuit of said first amplifier; and delay means to temporarily immunize said first amplifier to the output of said device.

4. The circuit of claim 3 including a connection between said second voltage divider and said input circuit of said second amplifier.

5. A delayed gain control circuit for a chain of amplifiers, comprising: a first amplifier of said chain having input and output circuits; a second amplifier of said chain having input and output circuits; a connection between said output circuit of said first amplifier and said input circuit of said second amplifier; means energized by an amplifier of said chain for producing a gain control signal; means to apply said gain control signal to said input circuit of said second amplifier, whereby strong incoming signals reduce the output of said second amplifier; means to obtain a correcting signal from said second amplifier in response to said gain control signal; means to amplify said correcting signal; and means to apply said amplified correcting signal to said input circuit of said first amplifier.

References Cited in the file of this patent

UNITED STATES PATENTS

| | | |
|---|---|---|
| 2,144,224 | Koch | Jan. 17, 1939 |
| 2,199,192 | Artzt | Apr. 30, 1940 |
| 2,304,331 | Belar | Dec. 8, 1942 |
| 2,559,038 | Bass | July 3, 1951 |
| 2,700,074 | Cotsworth | Jan. 18, 1955 |
| 2,760,008 | Schade | Aug. 21, 1956 |
| 2,786,900 | Stenning | Mar. 26, 1957 |

UNITED STATES PATENT OFFICE

CERTIFICATE OF CORRECTION

Patent No. 2,925,476 February 16, 1960

Zenas Atlas

It is hereby certified that error appears in the printed specification of the above numbered patent requiring correction and that the said Letters Patent should read as corrected below.

Column 2, line 48, for "increase" read -- decrease --.

Signed and sealed this 9th day of August 1960.

(SEAL)
Attest:

KARL H. AXLINE
Attesting Officer

ROBERT C. WATSON
Commissioner of Patents